United States Patent
Bliley et al.

(12) United States Patent     (10) Patent No.: US 6,856,106 B2
    (45) Date of Patent: Feb. 15, 2005

(54) H-BRIDGE APPARATUS AND METHOD

(75) Inventors: Paul D. Bliley, Vancouver, WA (US); William S. Eaton, Vancouver, WA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 152 days.

(21) Appl. No.: 10/286,041

(22) Filed: Oct. 31, 2002

(65) Prior Publication Data

US 2004/0085033 A1 May 6, 2004

(51) Int. Cl.[7] .................................................. H02P 7/74
(52) U.S. Cl. ........................ 318/34; 318/111; 318/112; 318/38; 318/41; 318/51
(58) Field of Search ................................ 318/111, 112, 318/34, 38, 41, 51

(56) References Cited

U.S. PATENT DOCUMENTS

| | | | | |
|---|---|---|---|---|
| 5,576,943 A | * | 11/1996 | Keir | 363/56.05 |
| 5,917,295 A | * | 6/1999 | Mongeau | 318/254 |
| 6,307,579 B1 | * | 10/2001 | Kida | 347/133 |
| 6,496,283 B1 | * | 12/2002 | Kabeya | 358/468 |
| 6,583,591 B2 | * | 6/2003 | Echols et al. | 318/112 |

* cited by examiner

*Primary Examiner*—Rita Leykin (57) ABSTRACT

An apparatus has a first H-bridge having a first motor contact on a shared first side and a second motor contact on a second side. The apparatus also has a half H-bridge having a third motor contact on a third side, wherein the shared first side of the first H-bridge and the third side of the half H-bridge may be operated as a second H-bridge. Another apparatus has a first H-bridge having a first motor contact on a shared first side and a second motor contact on a second side. The other apparatus also has a switch coupled to a third motor contact, wherein the shared first side of the first H-bridge and the switch may be operated as a partial H-bridge. A method of operating an alternate H-bridge and a method of flexibly using an H-bridge circuit on an ASIC are also provided.

20 Claims, 6 Drawing Sheets

H-BRIDGE APPARATUS AND METHOD

INTRODUCTION

Imaging mechanisms may include inkjet devices, electrophotographic devices, dye sublimation devices, and lithographic devices. Imaging mechanisms often make use of motors to drive paper path transport mechanisms, move imaging units such as reciprocating ink printheads or raster mirrors, or enable servicing subsystems such as printhead wipers, printhead caps, or electrostatic cleaning brushes. These are just a few examples of the things which may require separate motors within an imaging mechanism. Where possible, engineers often attempt to link more than one subsystem function to the same motor, so that fewer motors may be needed in an imaging mechanism. When the number of motors are settled-on, an appropriate application specific integrated circuit (ASIC) can procured or designed-and-built to allow the control of each of the motors in the imaging mechanism.

The motor control ASIC will often utilize an H-bridge circuit structure to enable a microprocessor or controller to control each motor in the imaging mechanism. One H-Bridge circuit on the ASIC is allotted to each motor being controlled. Just as it may be important to minimize the number of motors in an imaging mechanism to keep the cost of the imaging mechanism down, it is also important to keep the cost of the ASIC to a minimum. In general, minimizing the number of elements on the ASIC and the size of the ASIC will help to keep the cost of the ASIC down. Even small cost savings can have a dramatic benefit given the extremely large volume of imaging mechanisms which may be produced of a given design. Where possible, it is also beneficial to design ASIC's which can be used on different, but similar imaging devices. For example, two imaging mechanisms may have different designs which may require different motors and may even use those motors for different functions. The different designs, however, may have a quantity of motors in common and could possibly, therefore, share the same ASIC.

In trying to minimize ASIC cost by reducing the amount of circuitry on the ASIC and increasing the wide-spread reusability of the ASIC, engineers and designers are often met by a trade-off. A particular imaging mechanism platform may be planned at such high volumes that small reductions in cost will have a significant effect. However, in order to plan for ASIC re-use in a second product, the engineers often have to add circuitry to the ASIC which will not be used by the first product. It then becomes important to choose carefully between two options: 1) separate ASIC designs, where one of the ASIC designs has a significantly lower cost based on the product volume savings, or 2) a joint ASIC design which has a higher cost but makes ASIC re-use among different products possible.

Ideally, it would be beneficial to have an ASIC design for H-bridge control which would reduce the cost of a re-usable control ASIC while offering more flexibility of design use than separate ASIC designs.

DETAILED DESCRIPTION OF THE PREFERRED EMBODIMENTS

Figure 1:
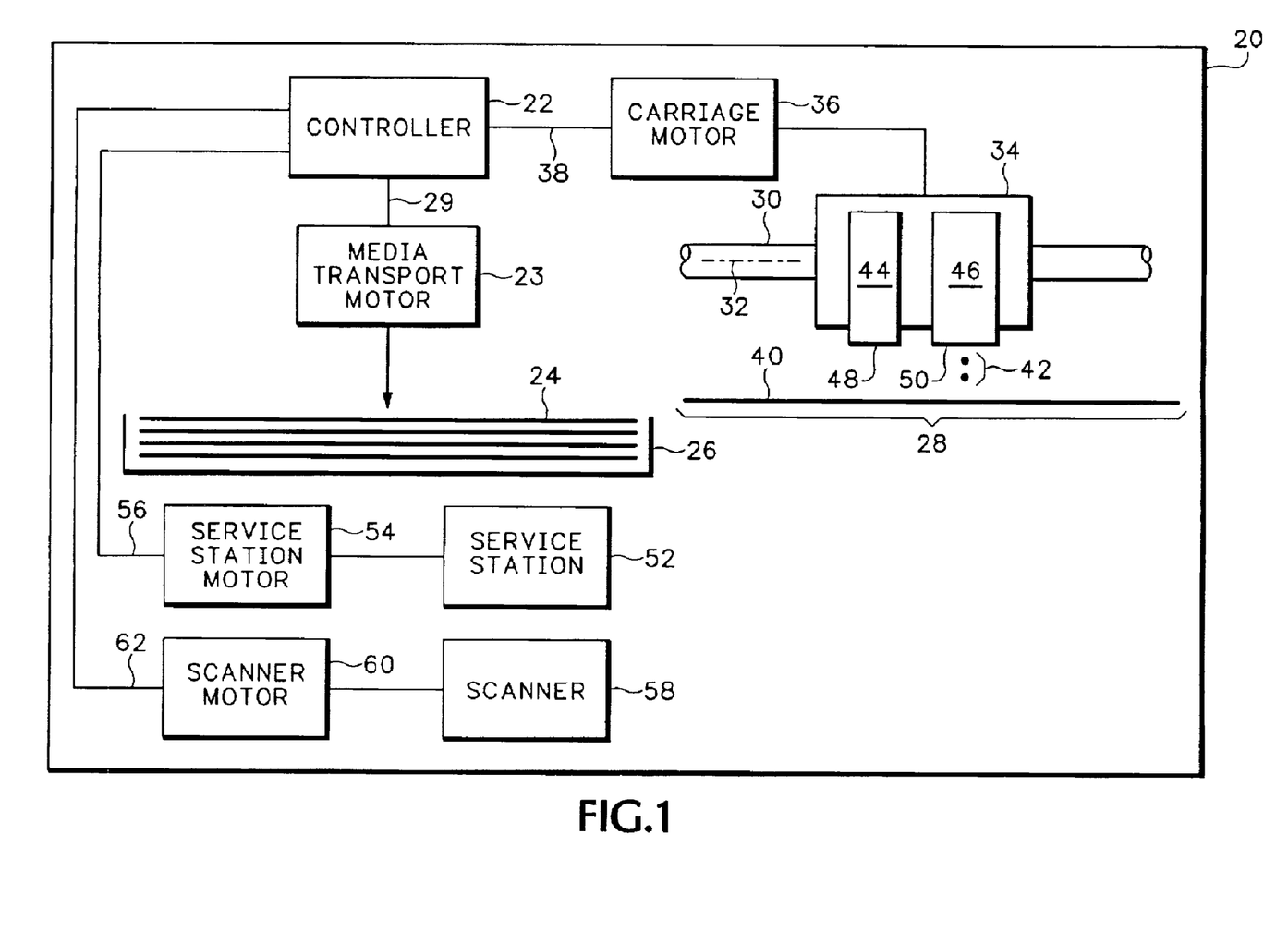
FIG. 1 schematically illustrates one embodiment of an imaging mechanism having subsystems.

FIG. 1 schematically illustrates one embodiment of an imaging mechanism 20 having subsystems. The imaging mechanism 20 may be used for imaging on a variety of media, such as paper, transparencies, coated media, cardstock, photo quality papers, and envelopes in an industrial, office, home or other environment. A variety of imaging mechanisms are commercially available. For instance, some of the imaging mechanisms that may embody the concepts described herein include desk top printers, portable printing units, wide-format printers, hybrid electrophotographic-inkjet printers, copiers, video printers, and facsimile machines, to name a few. For convenience the concepts introduced herein are described in the environment of an imaging mechanism 20.

The imaging mechanism 20 has a controller 22 which coordinates the operation of the various imaging subsystems in the imaging mechanism 20. The controller 22 can be a microprocessor, application specific integrated circuit (ASIC), computer, digital components, and/or analog components, depending on the device and implementation. A media transport motor 23, as part of a media transport system may be used to advance a sheet of print media 24 from the media input tray 26 through a printzone 28. The media transport motor 23 advances media 24 in response to a media transport control signal 29 from the controller 22. For the purposes of this specification, the term "media" is meant to include both one piece of print media as well as multiple sheets of print media.

The imaging mechanism 20 in this embodiment also has a carriage guide rod 30 which defines a scanning axis 32. The carriage guide rod 30 slidably supports a printhead carriage 34 for travel back and forth, reciprocally, across the printzone 28. A carriage drive motor 36 may be used to propel the carriage 34 in response to a carriage control signal 38 received from the controller 22. An optical encoder reader (not shown) may be mounted on the back surface of printhead carriage 34 to read positional information provided by an encoder strip, for example, as described in U.S. Pat. No. 5,276,970. The manner of providing positional feedback information via the encoder strip reader, may also be accomplished in a variety of ways known to those skilled in the art.

In the printzone 28, a media sheet 40 receives ink 42 from an inkjet cartridge, such as a black ink cartridge 44 and/or a color inkjet cartridge 46. Black ink cartridge 44 and color ink cartridge 46 are supported by printhead carriage 34. The black ink cartridge 44 is illustrated herein as containing a pigment-based ink. For the purposes of illustration, color cartridge 46 is described as containing three separate dye-based inks which are colored cyan, magenta, and yellow, although it is apparent that the color cartridge 46 may also contain pigment-based inks in some implementations. It is apparent that other types of inks may also be used in the cartridges 44 and 46, such as paraffin-based inks, as well as hybrid or composite inks having both dye and pigment characteristics. The illustrated imaging mechanism 20 uses replaceable printhead cartridges where each cartridge has a reservoir that carries the entire ink supply as the printhead reciprocates over the printzone 28. As used herein, the term "cartridge" may also refer to an "off-axis" ink delivery system, having main stationary reservoirs (not shown) for each ink (black, cyan, magenta, yellow, or other colors depending on the number of inks in the system) located in an ink supply region. In an off-axis system, the cartridges may be replenished by ink conveyed through a conventional flexible tubing system from the stationary main reservoirs which are located "off-axis" from the path of printhead travel, so only a small ink supply is propelled by carriage 34 across the printzone 28. Other ink delivery or fluid delivery systems may also employ the systems described herein, such as cartridges which have ink reservoirs that snap onto permanent or semi-permanent printheads.

The illustrated black cartridge 44 has a black printhead 48, and color cartridge 46 has a tri-color printhead 50 which ejects cyan, magenta, and yellow inks. The printheads 48, 50 selectively eject ink 42 to form an image on a sheet of media 40 when in the printzone 28. The printheads 48, 50 each have an orifice plate with a plurality of nozzles formed therethrough in a manner well known to those skilled in the art. The nozzles of each printhead 48, 50 are typically formed in at least one, but typically two linear arrays along the orifice plate. Thus, the term "linear" as used herein may be interpreted as "nearly linear" or substantially linear, and may include nozzle arrangements slightly offset from one another, for example, in a zigzag arrangement. Each linear array is typically aligned in a longitudinal direction perpendicular to the scanning axis 32, with the length of each array determining the maximum image swath for a single pass of the printhead. The printheads 48, 50 are thermal inkjet printheads, although other types of printheads may be used, such as piezoelectric printheads. The thermal printheads 48, 50 typically include a plurality of resistors which are associated with the nozzles. Upon energizing a selected resistor, a bubble of gas is formed which ejects a droplet of ink 42 from the nozzle and onto the print media 40 when in the printzone 28 under the nozzle. The printhead resistors are selectively energized in response to firing command control signals delivered from the controller 22 to the printhead carriage 34.

Between print jobs, the inkjet carriage 34 moves along the carriage guide rod 30 to a servicing region where a service station 52 may perform various servicing functions known to those in the art, such as, priming, scraping, and capping for storage during periods of non-use to prevent ink from drying and clogging the inkjet printhead nozzles. The service station 52 may contain a moveable pallet (not shown) which can be driven by a service station motor 54. The service station motor 54 is operated in response to a service station control signal 56 from the controller 22. An example of a moveable pallet in an inkjet cleaning service station can be found in U.S. Pat. No. 5,980,018.

The imaging mechanism 20 illustrated in FIG. 1 is a multifunction imaging device which, in addition to having printing capabilities, also has scanning capabilities. The imaging mechanism 20 has a scanner 58 which can either be moved over a flat platen glass (not shown) in order to collect a scanned image or which can advance an input printed image past the scanner 58. For simplicity of explanation, this specification will describe the scanner 58 as moveable over a flat platen glass. The scanner 58 may be moved by a scanner motor 60 in response to a scanner control signal 62 received from the controller 22.

Figure 2:
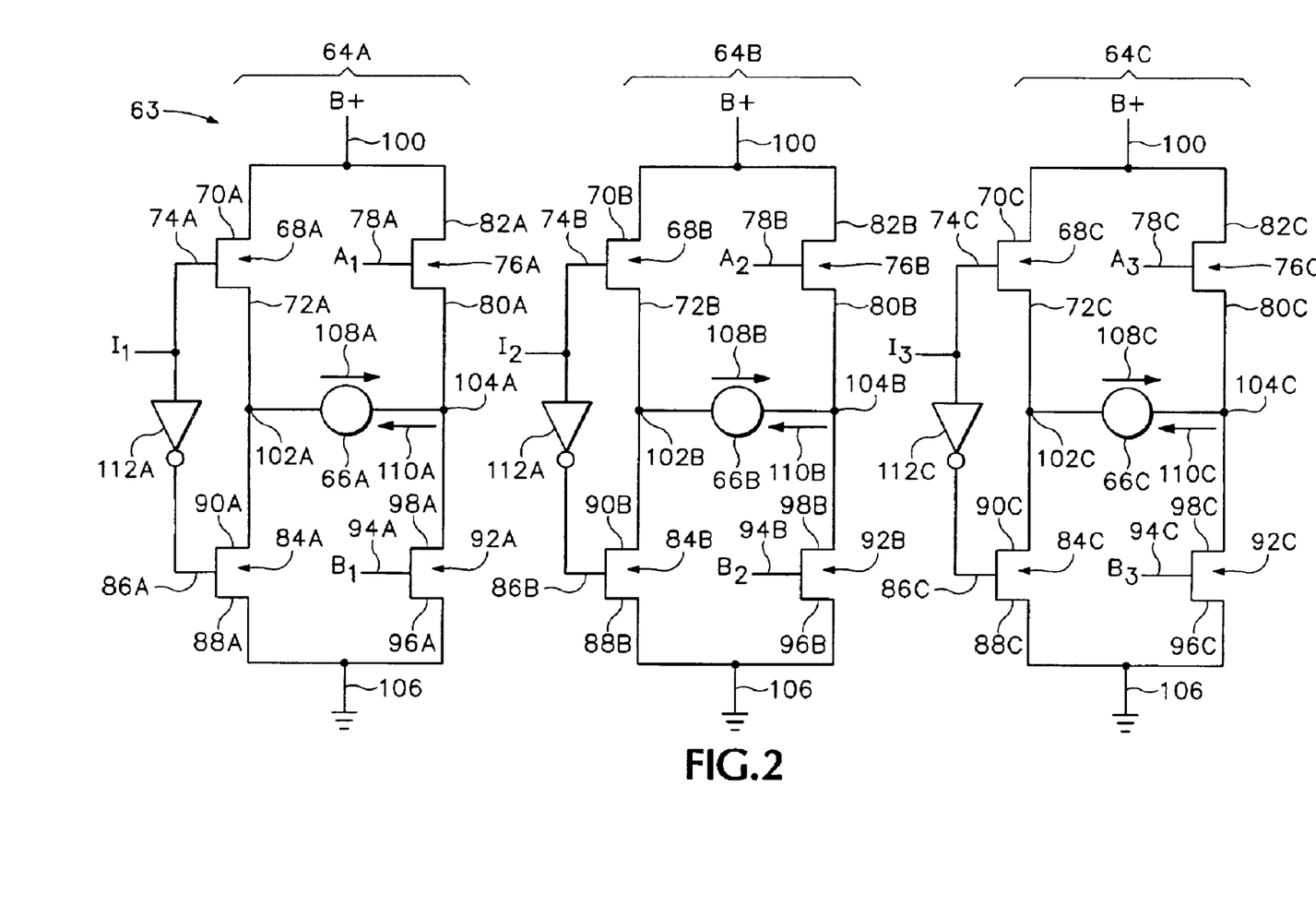
FIG. 2 schematically illustrates one embodiment of an ASIC used for motor control, featuring an H-bridge.

As illustrated, the imaging mechanism 20 contains four motors: the carriage motor 36, the media transport motor 23, the service station motor 54, and the scanner motor 60. Many other imaging devices do not contain a scanner motor 60, and instead of being considered a multi-function imaging device, they simply create hardcopy images. FIG. 2 schematically illustrates one embodiment of an ASIC 63 which may be used for motor control in an imaging device such as imaging device 20, without the scanning motor 60. One H-bridge circuit 64A, 64B, and 64C is allotted for each of three motors 66A, 66B, and 66C. Each of the H-bridges 64A, 64B, and 64C operate in similar fashion, so the operation of H-bridge 64A will be described for simplicity. The H-bridge 64A has a left and a right side. There are two switches on the left side and two switches on the right side. In FIG. 2, the switches are illustrated as field effect transistors (FET's), however, other types of switches such as bipolar transistors or relays could be used instead. H-bridge 64A has an upper left FET 68A. Upper left FET 68A has a drain 70A, a source 72A, and a gate 74A. When a threshold voltage potential is applied the gate 74A, current is able to conduct between the drain 70A and the source 72A. When the threshold voltage potential is not applied to the gate 74A, the no current flows between the drain 70A and the source 72A. This is how upper left FET 68A functions like a switch, and the other FET's described herein operate in a similar fashion.

H-bridge 64A has an upper right FET 76A which has a gate 78A, source 80A, and a drain 82A. H-bridge 64A also has a lower left FET 84A which has a gate 86A, source 88A, and drain 90A. H-bridge 64A further has a lower right FET 92A which has a gate 94A, a source 96A, and a drain 98A. A bias voltage 100 is coupled to the drain 70A and the drain 82A of the upper left FET 68A and the upper right FET 76A, respectively. The source 72A of the upper left FET 68 is coupled to a first motor contact point 102A. The source 80A is coupled to a second motor contact point 104A. The first and second motor contact points 102A, 104A are located on the ASIC 63 so that a motor 66A can be coupled between the first and second motor contact points 102A, 104A. It should be understood that the motors 66A, 66B, and 66C are not part of the ASIC 63, but rather are illustrated to show how they would be coupled to their motor contact points. The drain 90A of the lower left FET 84A is coupled to the first motor contact point 102A. The drain 98A of the lower right FET 92A is coupled to the second motor contact point 104A. The source 88A of the lower left FET 84A and the source 96A of the lower right FET 92A are coupled to a voltage ground 106.

As the illustrated H-bridge 64A is configured, when an appropriate threshold voltage is applied to the gate 74A of the upper left FET 68A and the gate 94A of the lower right FET 92A at the same time, while the upper right FET 76A and the lower left FET 84A are kept in a non-conducting state by not providing at least a threshold voltage to the gates 78A and 86A of those respective FET's, then there will be current conducted in a first direction 108A through the motor 66A. This will cause motor 66A to turn in a first direction. If instead, an appropriate threshold voltage is applied to the gate 78A of the upper right FET 76A and the gate 86A of the lower left FET 84A at the same time, while the upper left FET 68A and the lower right FET 92A are kept in a non-conducting state by not providing at least a threshold voltage to the gates 74A and 92A of those respective FET's, then there will be current conducted in a second direction 110A through the motor 66A. This will cause motor 66A to turn in a second direction. The motor can be prevented from rotating in either the first or second direction by turning off both of the right FET's 76A, 92A or both of the left FET's 68A, 84A. Other combinations of FET's can be turned off to prevent current from conducting in either the first direction 108A or the second direction 110A, thereby preventing the motor from rotating in either direction, and these combinations would be apparent to one skilled in the art.

As indicated, there are many possible ways to control the gates 74A, 78A, 88A, and 96A of the H-bridge FET's. The embodiment of FIG. 2 utilizes three inputs $I_1$, $A_1$, and $B_1$ to control the motor 66A. Second direction input $A_1$ is coupled to gate 78A of upper right FET 76A. First direction input $B_1$ is coupled to gate 94A of lower right FET 92A. Motor speed input $I_1$ is coupled to gate 74A of the upper left FET 68A. Motor speed input $I_1$ is also coupled to gate 86A of the lower left FET 84A after passing through an inverter 112A.

Second direction input $A_1$ and first direction input $B_1$ are used by the ASIC to control the motor as follows. If both $A_1$ and $B_1$ are disabled (not provided with at least a threshold turn-on voltage), then no current will flow through motor 66A in either direction, regardless of the state of motor speed input $I_1$. If second direction input $A_1$ is enabled (provided with at least a threshold turn-on voltage), while $B_1$ is disabled, then current will flow in the second direction 110A through the motor 66A in relation to a voltage pulse width modulation (PWM) applied to the motor speed input $I_1$. On the other hand, if $A_1$ is disabled, and first direction input $B_1$ is enabled, then current will flow in the first direction 108A through the motor 66A in relation to a voltage PWM applied to the motor speed input $I_1$. H-bridges 64B and 64C operate motors 66B and 66C, respectively, in similar fashion to H-bridge 64A, and therefore the operation of these additional bridges will not be described in detail. To note the similarity of operation, however, the elements of H-bridges 64B and 64C are numbered in similar fashion to H-bridge 64A, with the numbering post-fixes changed to "B" or "C".

Figure 3:
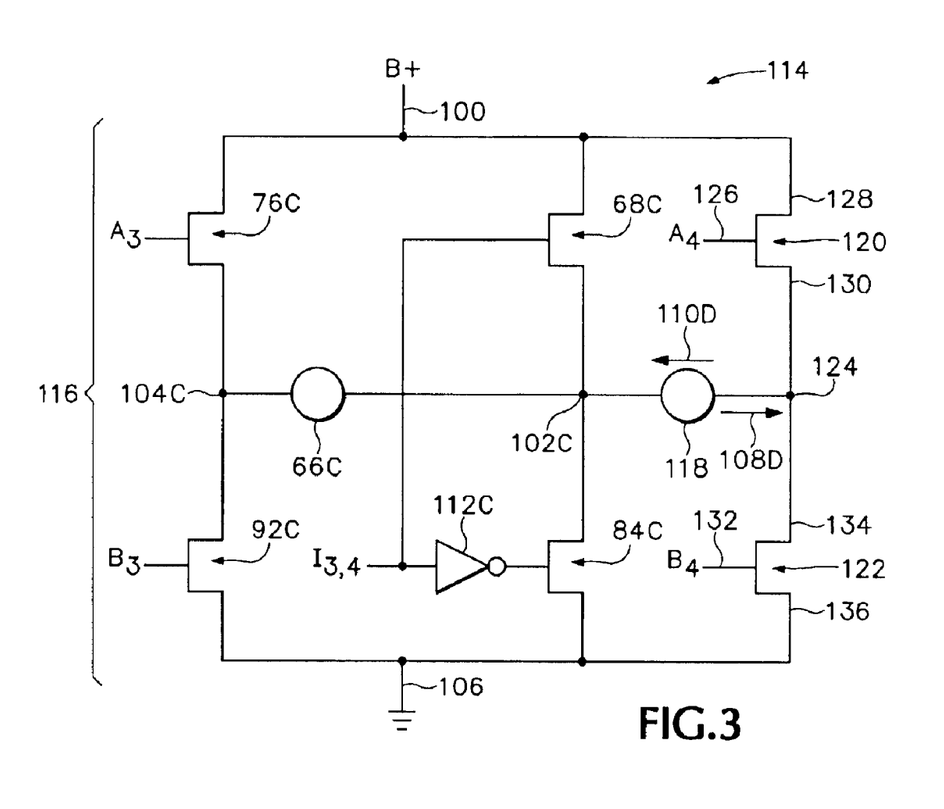
FIG. 3 schematically illustrates another embodiment of an ASIC used for motor control, featuring an alternate H-bridge.

FIG. 3 schematically illustrates another embodiment of an ASIC 114 used for motor control, featuring an alternate H-bridge 116. The alternate H-bridge 116 allows the option of an alternate motor 118 by adding two FET's to the H-bridge 64C design of FIG. 2, rather than the four FET's which are typically required when adding an additional H-bridge. The alternate H-bridge 116 has first and second switches (FET's 68C and 84C) on a first shared side which are coupled to the first motor contact 102C. The alternate H-bridge 116 also has third and fourth switches (FET's 76C and 92C) on a second side which are coupled to the second motor contact 104C. Motor 66C is coupled between first motor contact point 102C and second motor contact point 104C, and may be operated as described above by manipulating second direction input $A_3$, first direction input $B_3$, and motor speed input $I_{3,4}$. In some products, this may be all that is required, and the additional FET's 120 and 122 (fifth and sixth switches which form a half-H-bridge on a third side) may be ignored. On related, products, however, an alternate motor 118 may be connected between a third motor contact point 124 and the first motor contact point 102C. Thus, the third side of the half H-bridge and the shared first side may be operated as a second H-bridge.

Alternate upper FET 120 has a gate 126, a drain 128, and a source 130. Alternate lower FET 122 has a gate 132, a drain 134, and a source 136. The drain 128 of the alternate upper FET 120 is coupled to the bias voltage 100. The source 130 of the alternate upper FET 120 is coupled to the third motor contact point 124. The drain 134 of the alternate lower FET 122 is coupled to the third motor contact point 124. The source 136 of the alternate lower FET 122 is coupled to the voltage ground 106. Alternate second direction input $A_4$ is coupled to gate 126 of alternate upper FET 120. Alternate first direction input $B_4$ is coupled to gate 132 of alternate lower FET 122. By disabling the alternate first and second direction inputs $B_4$ and $A_4$, alternate motor 118 will be disabled and motor 66C can be operated by controlling first and second motor inputs $B_3$ and $A_3$ as described above with regard to FIG. 2. To operate alternate motor 118, first and second motor inputs $B_3$ and $A_3$ should be disabled. Then, if second direction input $A_4$ is enabled (provided with at least a threshold turn-on voltage), while $B_4$ is disabled, current will flow in a second direction 110D through the alternate motor 118 in relation to a voltage pulse width modulation (PWM) applied to the motor speed input $I_{3,4}$. On the other hand, if $A_4$ is disabled, and first direction input $B_4$ is enabled, then current will flow in a first direction 108D through the motor 118 in relation to a voltage PWM applied to the motor speed input $I_{3,4}$.

Therefore, by utilizing an alternate H-bridge like the embodiment illustrated in FIG. 3, designers have an option which can be used in ASIC design to help improve the trade-off between reducing ASIC cost by reducing the number of circuit elements on the ASIC and increasing ASIC re-usability by having extra capability to drive additional motors. The embodiment illustrated in FIG. 3 offers the option to have an additional motor while only adding two FET circuit elements, rather than four FET elements.

Figure 4:
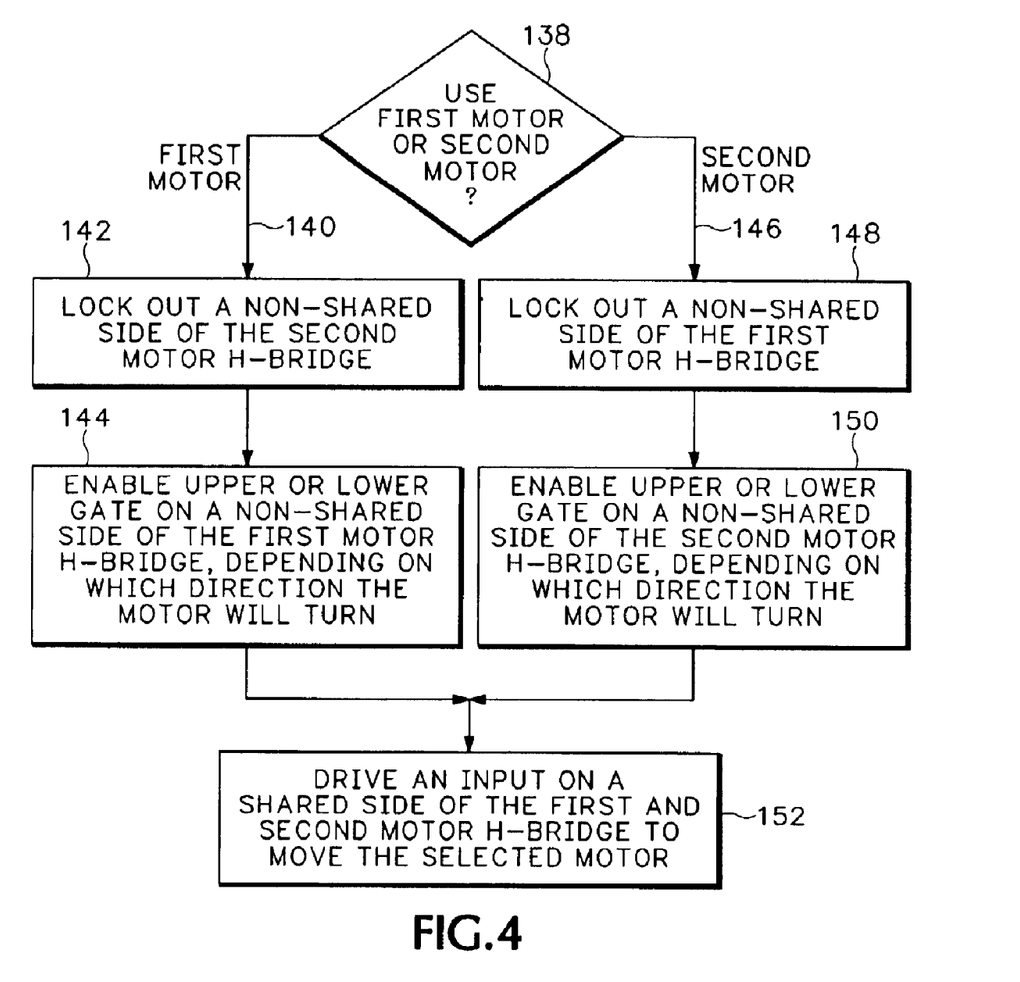
FIG. 4 illustrates one embodiment of actions which can be used to operate drive motors which are connected to an alternate H-bridge.

FIG. 4 illustrates one embodiment of actions which can be used to operate motors which are connected to an alternate H-bridge. The decision needs to be made as to whether to use 138 the first or second motor. With reference to FIG. 3, motor 66C could be considered a first motor, and alternate motor 118 could be considered a second motor. The alternate H-bridge 116 can be viewed as a first and a second H-bridge, each with a common, or shared side. Back to FIG. 4, if the decision is made to use the first motor 140, then the non-shared side of the second motor H-Bridge is locked-out 142. An upper or lower gate on a non-shared side of the first motor H-bridge is then enabled 144, depending on which direction it is desired to have the motor turn. If, instead, the decision is made to use the second motor 146, then the non-shared side of the first motor H-bridge is locked out 148. An upper or lower gate on a non-shared side of the second motor H-bridge is then enabled 150, depending on which direction it is desired to have the motor turn. Regardless of whether the upper or lower gates were enabled for the non-shared side of the first motor 144 or for the second motor 150, an input on the shared side of the first and second motor H-bridge is driven 152 to move the selected motor.

Figure 5:
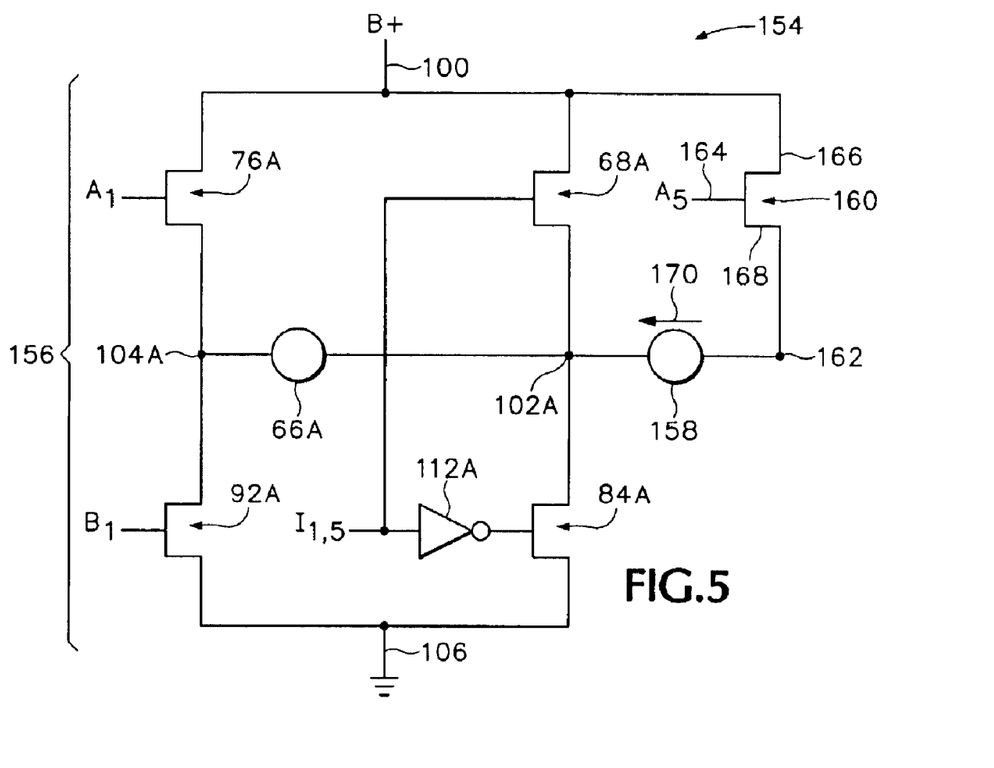
FIG. 5 schematically illustrates another embodiment of an ASIC used for motor control, featuring an alternate H-bridge.

FIG. 5 schematically illustrates another embodiment of an ASIC 154 used for motor control, featuring an alternate H-bridge 156. The alternate H-bridge 156 allows the operation of a second or alternate motor 158 by adding one FET to the H-bridge 64A design of FIG. 2, rather than the four FET's which are typically required when adding an additional H-bridge. The alternate H-bridge 156 has first and second switches (FET's 68C and 84C) on a first shared side which are coupled to the first motor contact 102C. The alternate H-bridge 156 also has third and fourth switches (FET's 76C and 92C) on a second side which are coupled to the second motor contact 104C. Motor 66A is coupled between first motor contact point 102A and second motor contact point 104A, and may be operated as described above by manipulating second direction input $A_1$, first direction input $B_1$, and motor speed input $I_{1,5}$. In some products, this may be all that is required, and the additional FET 160 (a fifth switch) may be ignored. On related, products, however, a second motor 158 may be connected between a third motor contact point 162 and the first motor contact point 102A. FET 160 is effectively a switch coupled to the third motor contact, wherein the shared first side and the switch may be operated as a partial H-bridge.

Alternate FET 160 has a gate 164, a drain 166, and a source 168. The drain 166 of the alternate FET 160 is coupled to the bias voltage 100. The source 168 of the alternate FET 160 is coupled to the third motor contact point 162. Alternate direction input $A_5$ is coupled to gate 164 of alternate FET 160. By disabling the alternate direction input $A_5$, alternate motor 158 will be disabled and motor 66A can be operated by controlling first and second motor inputs $B_1$ and $A_1$ as described above with regard to FIG. 2. To operate alternate motor 158, first and second motor inputs $B_1$ and $A_1$ should be disabled. Then, if direction input $A_5$ is enabled (provided with at least a threshold turn-on voltage), current will flow in direction 170 through the alternate motor 158 in relation to a voltage pulse width modulation (PWM) applied to the motor speed input $I_{1,5}$. With this embodiment, without rewiring the motor attachments to the alternate H-Bridge 156, the alternate motor can only turn in one direction. However, by utilizing an alternate H-bridge 156 like the embodiment illustrated in FIG. 5, designers have an option which can be used in ASIC design to help improve the trade-off between reducing ASIC cost by reducing the number of circuit elements on the ASIC and increasing ASIC re-usability by having extra capability to drive additional motors. The embodiment illustrated in FIG. 5 offers the option to have an additional motor while only adding one FET circuit element. It should also be noted that the alternate FET 160 could instead be coupled between the third motor contact point 162 and the voltage ground 106.

Figure 6A:
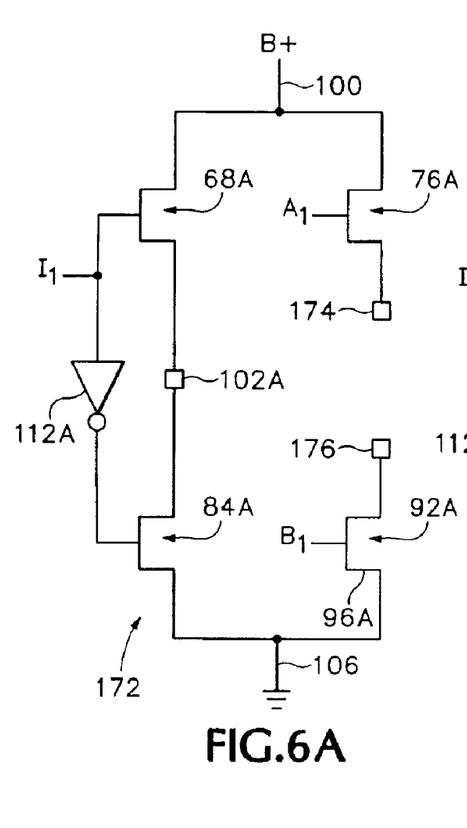
FIGS. 6A–6C schematically illustrate an alternate H-bridge ASIC design.
Figure 6B:
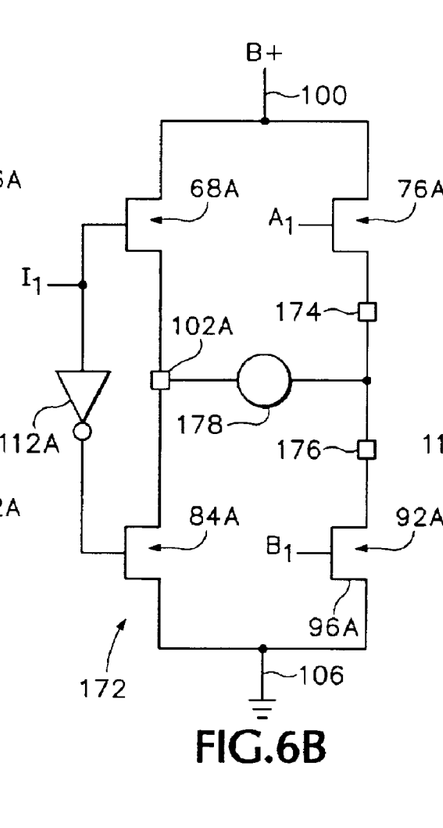
Figure 6C:
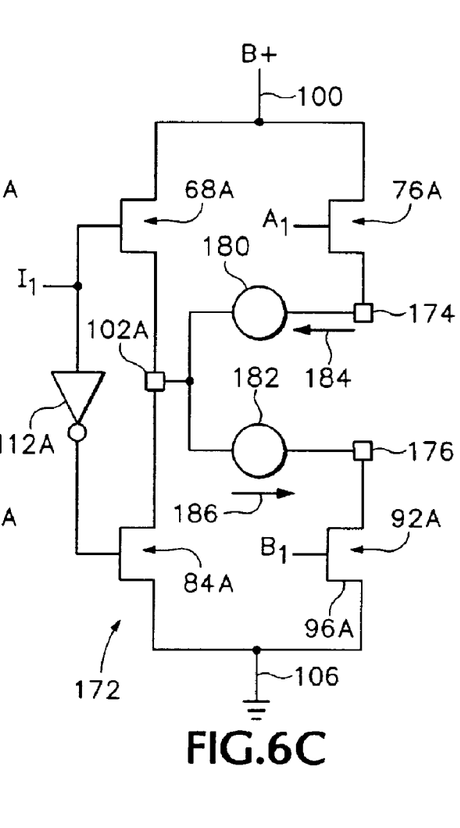

FIGS. 6A–6C schematically illustrate an alternate H-bridge 172. The alternate H-bridge 172 of FIGS. 6A–6C has similar FET elements 68A, 76A, 84A, and 92A as previously discussed with regard to FIG. 2. The alternate H-bridge 172 also has a similar inverter 112A and inputs $A_1$, $B_1$, and $I_1$ as previously discussed with regard to FIG. 2. On a first side of the H-bridge 172, the upper left FET 68A and the lower left FET 84A are both coupled to a first motor contact 102A as previously discussed with regard to FIG. 2. The upper right FET 76A and the lower right FET 92A are located on a second side of the H-bridge 172. The source of upper right FET 76A is coupled to a second motor contact 174. The drain of FET 92A is coupled to a third motor contact 176. Thus, the second and third motor contacts 174, 176 are on the second side.

FIG. 6B illustrates one way that the alternate H-bridge 172 can be used with one motor 178. One side of the motor 178 is coupled to the first motor contact 102A. A second side of the motor 178 is coupled to both the second motor contact 174 and the third motor contact 176. As wired in FIG. 6B, the alternate H-bridge 172 can be operated exactly as H-bridge 64A described previously with regard to FIG. 2. Motor 178 can be operated in two directions.

FIG. 6C illustrates another way that the alternate H-bridge 172 can be used, in this case, to support two motors. One side of a first motor 180 is coupled to the first motor contact 102A, while the other side of the first motor 180 is coupled to the second motor contact 174. One side of a second motor 182 is coupled to the first motor contact 102A, while the other side of the second motor 182 is coupled to the third motor contact 176. As wired in FIG. 6C, the alternate H-bridge 172 can be operated to turn either first motor 180 or second motor 182 in a single direction. With regard to FIG. 6C, input A1 may be referred to as the first motor input $A_1$, input $B_1$ may be referred to as second motor input $B_1$, and input $I_1$ may be referred to as motor speed input $I_1$. To keep both the first and second motors 180, 182 from rotating, first and second motor inputs $A_1$, $B_1$ are disabled (not provided with at least a turn-on threshold voltage). In this condition, regardless of the state of motor speed input $I_1$, the first and second motors 180, 182 will not move. If first motor input $A_1$ is enabled (provided with at least a turn-on threshold voltage), while second motor input $B_1$ is disabled, then a current will be able to flow in direction 184 in proportion to the PWM rate applied to the motor speed input $I_1$. This current will cause the first motor 180 to spin in one direction. If the second motor input $B_1$ is enabled, while the first motor input $A_1$ is disabled, then a current will be able to flow in direction 186 in proportion to the PWM rate applied to the motor speed input $I_1$. This current will cause the second motor 182 to spin in one direction.

Therefore, by utilizing an alternate H-bridge like the embodiment illustrated in FIGS. 6A–6C, designers have an option which can be used in ASIC design to help improve the trade-off between reducing ASIC cost by reducing the number of circuit elements on the ASIC and increasing ASIC re-usability by having extra capability to drive additional motors. The embodiment illustrated in FIGS. 6A–6C offers the option to have an additional motor while only adding a third motor contact element, and without adding any other FET elements.

An alternate H-bridge, like each of the systems illustrated in FIGS. 3, 5, and 6A–6C provides the ability offer more flexibility and scalability in design without the commensurate cost traditionally associated with ASIC design by reducing the number of elements which must be incorporated on an ASIC to control motors. In discussing various components and embodiments of alternate H-bridges, ASIC's, and methods, various benefits have been noted above.

It is apparent that a variety of other, equivalent modifications and substitutions may be made to the alternate H-bridges, ASIC's, and methods embodied in this specification, according to the concepts covered herein, depending upon the particular implementation, while still falling within the scope of the claims below.

We claim:

1. An ASIC, comprising:
   a first H-bridge having a first motor contact to connect to a first motor on a shared first side of the first H-bridge and a second motor contact to connect to the first motor on a second side;
   a half H-bridge having a third motor contact on a third side, the first motor contact on the shared first side of the first H-bridge and the third motor contact on the third side to connect with a second motor, wherein the shared first side and the third side to the ASIC may be operated as a second H-bridge to connect the first motor contact and the third motor contact across the second motor.

2. The apparatus of claim 1, wherein:
   the first H-bridge is configured to allow a first motor connected between the first and second motor contacts to be driven in a first and second direction; and
   the second H-bridge is configured to allow a second motor connected between the first and third motor contacts to be driven in a first and a second direction.

3. An imaging mechanism, comprising:
   a printhead carriage configured to receive a printhead;
   a carriage motor coupled to the printhead carriage; and
   the ASIC of claim 1, wherein the carriage motor can be connected to the ASIC as either the first motor or the second motor.

4. An apparatus, comprising:
a first H-bridge having a first motor contact to connect to a first motor on a shared first side of the first H-bridge and a second motor contact to connect to the first motor on a second side of the first H-bridge;
a single switch coupled to a third motor contact, wherein the shared first side of the first H-bridge and the single switch may be operated as a partial H-bridge to connect the first motor contact and the third motor contact with a second motor.

5. The apparatus of claim 4, wherein:
the first H-bridge is configured to allow a first motor connected between the first and second motor contacts to be driven in a first and second direction; and
the partial H-bridge is configured to allow a second motor connected between the first and third motor contacts to be driven in a first direction.

6. An imaging mechanism, comprising:
a printhead carriage configured to receive a printhead;
a carriage motor coupled to the printhead carriage; and
the apparatus of claim 4, wherein the carriage motor is connected to the apparatus as either the first motor or the second motor.

7. An apparatus, comprising
an ASIC having first and second sides;
a first motor contact on the first side;
a second motor contact coupled to a single switch on the second side; and
a third motor contact coupled to a single switch on the second side.

8. The apparatus of claim 7, wherein:
the first motor contact is coupled to a first side of a motor; and
the second and third motor contacts can be coupled together and can be coupled to a second side of the motor.

9. The apparatus of claim 7, wherein:
the first motor contact is coupled to a first side of a first motor;
the first motor contact is coupled to a first side of a second motor;
the second motor contact is coupled to a second side of the first motor; and
the third motor contact is coupled to a second side of the second motor.

10. An imaging mechanism, comprising:
a printhead carriage configured to receive a printhead;
a carriage motor coupled to the printhead carriage; and
the apparatus of claim 7, wherein the carriage motor is connected to the first motor contact.

11. A method of operating an alternate H-bridge on an ASIC comprising:
receiving a signal to the ASIC indicating whether or not to use a first motor or a second motor;
locking out a first non-shared side of the alternate H-bridge on the ASIC attached to the motor not being used;
enabling an upper or a lower switch on an other non-shared side of the alternate H-bridge on the ASIC attached to the motor being used; and
driving an input on a shared side of the alternate H-bridge on the ASIC to move the motor being used.

12. An ASIC, comprising:
first, second, third, fourth, and fifth switches on the ASIC;
first, second, and third motor contacts on the ASIC;
wherein:
the first and second switches are coupled to the first motor contact;
the third and fourth switches are coupled to the second motor contact;
the fifth switch is coupled to the third motor contact;
a switch combination selected from the group consisting of 1) the first and fourth switches, 2) the second and third switches, and 3) the second and fifth switches may be activated to control a first motor coupled between the first and second motor contacts in two directions, or to control a second motor coupled between the first and third contacts in one direction.

13. The apparatus of claim 12, wherein the first, second, third, fourth, and fifth switches comprise at least one field effect transistor.

14. The apparatus of claim 12, wherein the first, second, third, fourth, and fifth switches comprise at least on bi-polar transistor.

15. The apparatus of claim 12, wherein the first, second, third fourth, and fifth switches comprise at least one relay.

16. The apparatus of claim 12, further comprising:
a sixth switch, wherein the sixth switch is coupled to the third motor contact; and
wherein a switch combination selected from the group consisting of 1) the first and fourth switches, 2) the second and third switches, 3) the second and fifth switches, and 4) the first and sixth switches may be activated to control a first motor coupled between the first and second motor contacts in two directions, or to control a second motor coupled between the first and third contacts in two directions.

17. The apparatus of claim 16, wherein the first, second, third, fourth, fifth, and sixth switches comprise at least one field effect transistor.

18. The apparatus of claim 16, wherein the first, second, third, fourth, fifth, and sixth switches comprise at least one bi-polar transistor.

19. The apparatus of claim 16, wherein the first, second, third, fourth, fifth, and sixth switches comprise at least one relay.

20. A method of flexibility using an alternative H-bridge circuit on an ASIC, comprising:
providing a first motor contact on a first side of the alternative H-bridge;
providing a second motor contact on a second side of the alternative H-bridge
providing a third motor contact, not coupled to the second motor contact, on the second side of the H-bridge;
to connect only a first motor to the alternative H-bridge, then:
coupling a first side of the first motor to the first motor contact; and
coupling a second side of the first motor to both of the second and third motor contacts; and
to connect both the first motor and a second motor to the alternative H-bridge, then:
coupling a first side of the first motor to the first motor contact;
coupling a first side of the second motor to the first motor contact;
coupling a second side of the first motor to the second motor contact; and
coupling a second side of the second motor to the third motor contact.

* * * * *